(12) United States Patent
Kouvetakis et al.

(10) Patent No.: US 7,374,738 B2
(45) Date of Patent: May 20, 2008

(54) SUPERHARD DIELECTRIC COMPOUNDS AND METHODS OF PREPARATION

(75) Inventors: John Kouvetakis, Mesa, AZ (US); Ignatius S. Tsong, Tempe, AZ (US); Levi Torrison, Mesa, AZ (US); John Tolle, Gilbert, AZ (US)

(73) Assignee: Arizona Board of Regents, acting for and on behalf of, Arizona State University, Tempe, AZ (US)

( * ) Notice: Subject to any disclaimer, the term of this patent is extended or adjusted under 35 U.S.C. 154(b) by 330 days.

(21) Appl. No.: 10/492,271

(22) PCT Filed: Oct. 10, 2002

(86) PCT No.: PCT/US02/32499

§ 371 (c)(1),
(2), (4) Date: Apr. 8, 2004

(87) PCT Pub. No.: WO03/058644

PCT Pub. Date: Jul. 17, 2003

(65) Prior Publication Data

US 2004/0191151 A1     Sep. 30, 2004

Related U.S. Application Data

(60) Provisional application No. 60/328,967, filed on Oct. 11, 2001.

(51) Int. Cl.
  *C01B 35/10* (2006.01)
  *C01B 21/082* (2006.01)
  *C01B 33/00* (2006.01)

(52) U.S. Cl. .......... 423/277; 423/325; 423/326; 423/327.1; 423/365

(58) Field of Classification Search ......... 423/277, 423/327.1, 325, 326, 365
See application file for complete search history.

(56) References Cited

U.S. PATENT DOCUMENTS

| | | | |
|---|---|---|---|
| 3,765,935 | A | 10/1973 | Rand et al. |
| 4,329,482 | A | 5/1982 | Elsheikh |
| 5,571,757 | A | 11/1996 | Groen et al. |
| 5,837,217 | A | 11/1998 | Nielson et al. |
| 6,180,809 | B1 * | 1/2001 | Pillot et al. ............ 556/402 |

OTHER PUBLICATIONS

Baraton et al.,—"Attribution Des Absorptions Du Spectre Infrarouge Aux Vibrations Fondamentales", Mat. Res. Bull. 20, pp. 1239-1250, 1985, no month.

(Continued)

*Primary Examiner*—Wayne A. Langel
(74) *Attorney, Agent, or Firm*—McDonnell Boehnen Hulbert & Berghoff LLP (57) ABSTRACT

Novel superhard dielectric compounds useful as gate dielectrics discovered. Low temperature methods for making thin films of the compounds on substrate silicon are provided. The methods comprise the step of contacting a precursor having the formula $H_3X$—O—$XH_3$, wherein X is silicon or carbon with a compound comprising boron or nitrogen in a chemical vapor deposition (CVD) chamber or with one or more atomic elements in a molecular beam epitaxial deposition (MBE) chamber. These thin film constructs are useful as components of microelectronic devices, and specifically as gate dielectrics in CMOS devices.

1 Claim, 7 Drawing Sheets

OTHER PUBLICATIONS

Buchanan, D.A., "Scaling the gate dielectric: Materials, integration, and reliability", IBM J. Res. Develop., 43(3):245-264, 1999, no month.

Dey et al., "Atomic layer chemical vapor deposition of $ZrO_2$-based dielectric films: Nanostructure and nanochemistry", J. App. Phys., 93(7):4144-4157, 2003, no month.

Dey et al., "Electrical Properties of Paraelectric $(Pb_{0.72}La_{0.28})TiO_3$ Thin Films with High Linear Dielectric Permittivity: Schottky and Ohmic Contacts", Jpn. J. Appl. Phys., 34:3142-3152, 1995, no month.

Garfunkel et al., eds., "Fundamental Aspects of Ultrathin Dielectrics on Si-based Devices", pp. 79-88, Kluwer Acad. Publishers, Dordrecht, The Netherlands, 1998, no month.

Gusev et al., "Growth and characterization of ultrathin nitrided silicon oxide films", IBM J. Res. Develop., 43:265-285, 1999, no month.

Habraken et al., "Silicon nitride and oxynitride films", Mater. Sci. Eng., R12:123-175, 1994, no month.

Hattangady et al., "Integrated processing of silicon oxynitride films by combined plasma and rapid-thermal processing", J. Vac. Sci. Technol., 14(6):3017-3023, 1996, no month.

Houssa et al., "Effect of $O_2$ post-deposition anneals on the properties of ultra-thin $SiO_x/ZrO_2$ gate dielectric stacks", Semicond. Sci. Technol., 16:31-38, 2001, no month.

Idrestedt et al., "Structure of $Si_2N_2O$", Acta Chem. Scand. 18(8):1879-1886, 1964, no month.

Johnson et al., "Physical and electrical properties of noncrystalline Al2O3 prepared by remote plasma enhanced chemical vapor deposition", J. Vac. Sci. Technol. 19(4):1353-1360, 2001, no month.

Lai et al., "A study of the relationship between $Si/SiO_2$ between interface charges and roughness", J. Vac. Sci. Technol., 17(1):53-59, 1999, no month.

Lednor et al., "The preparation of silicon oxynitride, $Si_2N_2O$, as high surface area powder by reaction of silica with ammonia at 1100° C", J. Chem. Soc., Chem. Commun., pp. 320-321, 1989, no month.

Lucovsky, G., "Ultrathin nitrided gate dielectrics: Plasma processing chemical characterization, performance and reliability", IBM J. Res. Develop., 43(3):301-326, 1999, no month.

Ma, T.P., "JVD Silicon Nitride and Titanium Oxide as Advanced Gate Dielectrics", Mat. Res. Symp. Proc., 567:73-112, 1999, no month.

Roucka et al., "Low-temperature epitaxial growth of the quarternary wide band gap semiconductor SiCAlN", Phys. Rev. Let., 88(20), 4 pages, 2002, no month.

Roucka et al., "Low-temperature growth of SiCAlN films of high hardness on Si(111) substrates", Appl. Phys. Let., 79(18):2880-2882, 2001, no month.

Schroder, D., "Semiconductor Material and Device Characterization", 2nd ed., Chapter 1, John Wiley & Sons, Inc., 1998, no month.

Shriver et al., "The manipulation of airsensitive compounds", pp. 289-311, Wiley & Sons, Inc., 1986, no month.

Srinivasa et al., "High-pressure neutron diffraction study of $Si_2N_2O$", J. Appl. Cryst., 10:167-171, 1977, no month.

van Weeren et al., "Synthesis and characterization of amorphous Si2N2O", J. Am. Ceram. Soc., 77:2699-2702, 1994, no month.

Wallace et al., eds., "Alternative gate dielectrics for microelectronics", MRS Bulletin, 27(3):186-191, 2002, no month.

\* cited by examiner

SUPERHARD DIELECTRIC COMPOUNDS AND METHODS OF PREPARATION

CROSS REFERENCE

This Application is a U.S. National Stage Application filed under 35 U.S.C. 371 claiming priority from the International Application Serial No. PCT/US02/32499, filed Oct. 10, 2002, which claims priority from U.S. Provisional Patent Application Ser. No. 60/328,967, filed Oct. 11, 2001, and which applications are incorporated herein by reference. [This application claims priority from U.S. Provisional Patent Application Ser. No. 60/328,967 filed Oct. 11, 2001, the disclosure of which is incorporated by reference herein in its entirety.]

STATEMENT OF GOVERNMENT FUNDING

The U.S. Government through the US Army Research Office provided financial assistance for this project under Grant No. DAAD19-00-1-0471 and through the National Science Foundation under Grant No. DMR-9986271, Grant No. DMR 9902417 and Grant No. ECS 0000121. Therefore, the United States Government may own certain rights to this invention.

FIELD OF INVENTION

This invention relates generally to certain super-hard dielectric compounds useful as gate dielectrics in microelectronic devices. Low temperature methods for depositing thin films of these compounds onto silicon substrates are presented.

BACKGROUND

Recently, the challenge of creating smaller dimensions in microelectronic devices has demanded the use of new materials for the gate dielectric—either thinner silicon oxide layers or new compounds having a higher dielectric constant.

Silicon dioxide ($SiO_2$) is a classical refractory material and the most common gate dielectric in microelectronic devices. Its structure is made up of $SiO_2$ tetrahedra in which each oxygen forms two bonds with neighboring Si atoms (($SiO^4$)$^{-4}$ tetrahedra connected through bridging oxygens). The performance of $SiO_2$-containing devices is limited by dopant diffusion out of poly-Si and direct tunneling through $SiO_2$, and when off-state, power dissipation becomes comparable to active power.

Current efforts are focused on replacing $SiO_2$ with nitride ($Si_3N_4$) or oxynitride (SiOxNy) films with K ~5-7.5 [1-6] or with alternative higher K (~20-30) films [7,8]. In recent years, nitride oxides (silicon oxynitrides) have been widely investigated as possible substitutes for $SiO_2$ because of their higher stability and durability, their ability to prevent boron diffusion, and their higher dielectric constant. The introduction of three-coordinate nitrogen into $SiO_2$ increases the cross-linking in the structure, resulting in a compound having higher density, strength, and hardness in comparison to the pure silicon oxide. Compounds in the Si—O—N system exhibit good thermal, chemical, and mechanical stability, as well as diffusive barrier and dielectric properties [9]. In addition, $Si_2N_2O$ has superior oxidation resistance and thermal shock resistance compared to $Si_3N_4$. Most of the reported Si—O—N systems are amorphous and appear to have a higher dielectric constant than the pure oxide.

However, crystalline materials with well-defined compositions and structures have been sought which will give significant improvements in mechanical and electrical properties over more amorphous forms of these compounds. The synthesis of phases with well-defined composition and structure is desirable because it may lead to significant improvements and/or controllability in the mechanical, electrical, and dielectric properties [10, 11].

Figure 2:
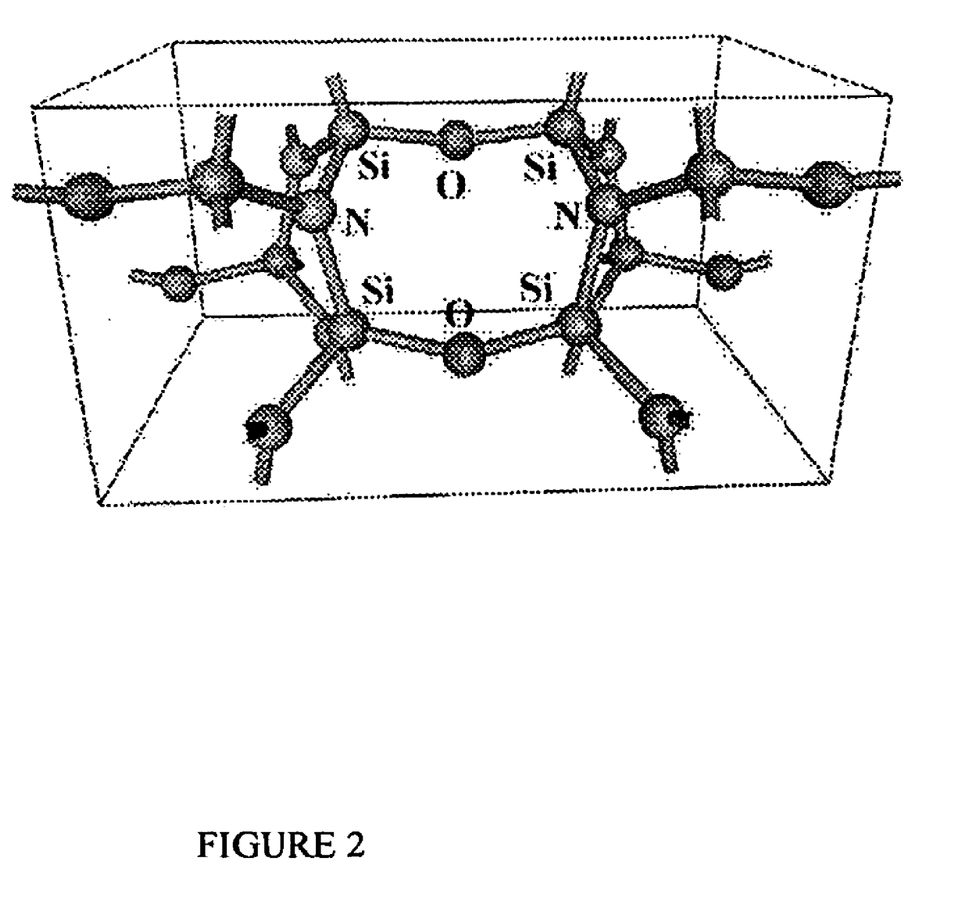
FIG. 2 is a ball-and-stick model illustrating the structure of $Si_2N_2O$

One such phase is stoichiometric, silicon oxynitride ($Si_2N_2O$), a refractory material having all the aforementioned and desirable properties. $Si_2N_2O$ has the high-pressure $B_2O_3$ structure [12] and is composed of $SiN_3O$ tetrahedral, corner-linked by O and N atoms. This structure is illustrated in FIG. 2. In this structure, the oxygen bridges two Si (as in $SiO_2$) and the N and Si atoms are, respectively, in three and four fold coordination as in $Si_3N_4$ [13].

The synthesis of this compound and the search for related silicon-based dielectric materials has been the focus of intense research because of their potential for enhanced performance compared to $SiO_2$ and $Si_3N_4$ based devices [14,15]. However, despite their attractive properties, a suitable synthesis technique for silicon oxynitrides and related dielectrics at relatively low processing temperatures, as required in silicon device technology, is still lacking.

SUMMARY

Novel superhard dielectric compounds useful as gate dielectrics in microelectronic devices have been discovered. Low temperature methods for making thin films of the compounds on substrate silicon are provided. The methods comprise the step of contacting a precursor having the formula $H_3X$—O—$XH_3$, wherein X is silicon or carbon with a compound comprising boron or nitrogen in a chemical vapor deposition (CVD) chamber or with one or more atomic elements in a molecular beam epitaxial deposition (MBE) chamber. These thin film constructs are useful as components of microelectronic devices, and specifically as gate dielectrics in CMOS devices.

Compounds having a formulae XqYpZtO wherein X is silicon or carbon, Y is boron or nitrogen, Z is gallium or aluminum, O is oxygen and q and p are each an integer having a value of 1,2 or 3 and t is zero or 1, provided that when X is silicon, and t is zero, Y is not nitrogen are presented. Also presented are non-stoichiometric compounds having the formulae XqYpZtO wherein X is silicon or carbon, Y is boron or nitrogen, Z is gallium or aluminum, O is oxygen wherein one or more of the values of q, p or t are non-integral.

In certain preferred embodiments of the invention the compounds have a dielectric constant between 3 and 7, most preferably between about 5.5 and 6.6.

In certain other preferred embodiments the compounds have a hardness of between about 17 to 25 GPa.

In one preferred embodiment of the present invention X is Si and Y is boron and most
preferably have the formula $Si_2B_2O$ or $SiB_2O$.

In other preferred embodiments of the present invention, X is carbon and Y is boron and most preferably has the formula $C_2B_2O$.

In other preferred embodiments X is silicon, Y is nitrogen and Z is aluminum, most preferably the compound having the formula $Si_2N_3AlO$.

Most preferably the non-stoichiometric compounds of the present invention are silicoxynitrides wherein X is silicon, Y is nitrogen and the values of q, p and t are non-integral.

In an important aspect of the present invention, the compounds are provided as thin films deposited on a silicon substrate. Preferably thin films of the compounds of the present invention have a thickness of between about 5 and 500 nm Most preferably the silicon substrate, a silicon wafer, e.g., is Si(100), Si(111) or doped Si(111) as generally utilized as semiconductor devices. In certain preferred embodiments, the silicon substrate comprises a native oxide layer. In other preferred embodiments, the silicon substrate is cleaned prior to deposition of film In yet other preferred embodiments the silicon substrate comprises compliant buffer layers Substrates other than silicon generally employed in semiconductor devices may likewise be utilized.

In an important aspect of the present invention, microelectronic devices comprising the present thin film of any of the compounds of the present invention deposited on a suitable substrate are provided. Because of their dielectric and other physical properties, thin films of the compounds of the present invention are useful gate dielectrics in microelectronic devices CMOS, e.g., and may be incorporated into semiconductor devices generally as substrates for other components of integrated circuits by methods known in the art.

In another important aspect of the invention, low temperature methods for preparing thin film of the present superhard dielectric compounds are provided. These low-temperature methods are compatible with current silicon processing technologies. Methods are provided for preparing thin films of compounds having a formulae XqYpZtO wherein X is silicon or carbon, Y is boron or nitrogen, Z is gallium or aluminum, O is oxygen and q and p are each an integer having a value of 1, 2 or 3 and t is zero or 1 comprising the step of contacting precursor having the formula $H_3X$—O—$XH_3$ with a reactive species containing Y or Z in the presence of substrate under conditions whereby thin film of the compound is deposited on the substrate. Methods are provided for contacting the precursor and reactive species in a chemical vapor deposition (CVD) chamber or a molecular beam epitaxial (MBE) chamber. The thin films prepared by the methods generally have a thickness between about 5 and 500 nm Preferably, the substrate is Si(100), Si(111) or doped Si(111). Other substrates known to the art and used as substrate in preparation of thin film devices may also be employed. In certain preferred embodiments of the invention, the substrate comprises a native oxide layer. In certain other preferred embodiments, the substrate is cleaned prior to deposition of thin film compounds. In yet other preferred embodiments the substrate may comprise a compliant buffer layer.

In certain preferred embodiments of the method of the present invention, methods are presented for preparing a compound having the formula XqYpO wherein X is silicon, Y is boron, O is oxygen and q and p are each an integer having a value of 1 or 2, comprising the step of contacting a precursor having the formula $H_3X$—O—$XH_3$ with a reactive compound having the formula $(YL_3)_v$ wherein L is hydrogen or halide and v is 1 or 2 in the presence of substrate in a chemical vapor deposition chamber under conditions whereby thin film of said compound is deposited on said substrate. Thin films made by this preferred method are presented. Microelectronic devices comprising the deposited thin films are presented.

In a preferred embodiment of this method, low temperature methods for depositing superhard dielectric thin films of $Si_2B_2O$ on a silicon substrate are presented. In these embodiments, essentially equimolar amounts of precursor $H_3SiOSiH_3$ and $(BH_3)_2$ are contacted in a CVD chamber at a temperature at about 700° C. to 1000° C., most preferably about 700° C., in the presence of the silicon substrate under conditions whereby the $H_3SiOSiH_3$ and $B_2H_6$ react to form thin film of $Si_2B_2O$ on the silicon substrate. In these preferred embodiments, films of $Si_2B_2O$ having a thickness of about 5 to 500 nm may be formed on silicon substrate, Si(100) or Si(111) or doped Si(111), for example. The substrate may comprise a native oxide layer, or may be cleaned before the deposition of film Thin film of $Si_2B_2O$ on a silicon substrate thin film of $Si_2B_2O$ are provided.

In another preferred embodiment, low temperature methods for depositing superhard dielectric thin films of $SiB_2O$ on a silicon substrate are presented. In these embodiments, equimolar amounts of precursor $H_3SiOSiH_3$ and $(BH_3)_2$ are contacted in a CVD chamber at a temperature between about 500-650° C. in the presence of the silicon substrate under conditions whereby the $H_3SiOSiH_3$ and $B_2H_6$ react to form thin film of $Si_2B_2O$ on the silicon substrate. In these preferred embodiments, films of $SiB_2O$ having a thickness of about 5 to 500 nm may be formed on silicon substrate, Si(100) or Si(111) or doped Si(111), for example. The substrate may comprise a native oxide layer or may be cleaned before the deposition of film 34. Thin film of $SiB_2O$ on a silicon substrate is provided.

In an important aspect of the invention, microelectronic devices comprising thin film of silicoxyborides, most specifically $SiB_2O$ or $Si_2B_2O$ are given.

In yet another preferred embodiment, low temperature methods for depositing superhard dielectric thin films of $Si_2N_2O$ on a silicon substrate are presented. In these preferred embodiments, essentially equimolar amounts of precursor $H_3SiOSiH_3$ and $NH_3$ are contacted in a CVD chamber at a temperature between about 650° C. to 850° C. in the presence of the silicon substrate under conditions whereby the $H_3SiOSiH_3$ and $NH_3$ react to form thin film of $Si_2N_2O$ on the silicon substrate. In this preferred method, thin film of $Si_2N_2O$ having a thickness of about 5 to 500 nm may be formed on a silicon substrate, Si(100) or Si(111) or doped Si(111), for example. The substrate may comprise a native oxide layer or may be cleaned prior to deposition of film. Thin film of $Si_2N_2O$ on a silicon substrate prepared by these methods are given.

In another important aspect of the invention microelectronic devices comprising thin film of $Si_2N_2O$ made by the methods of the present invention are presented.

In yet another preferred embodiment of the present invention, methods for depositing superhard thin films of $B_2C_2O$ on a silicon substrate are presented. In these preferred methods, essentially equimolar amounts of $H_3COCH_3$ and $BCl_3$ are contacted in said chamber at a temperature between about 650° C. to 850° C. in the presence of the silicon substrate under conditions whereby the $H_3COCH_3$ and $BCl_3$ react to form thin film of $B_2C_2O$ on the silicon substrate. $B_2C_2O$ films formed by these methods may have a thickness of about 5 to 500 nm The substrate is preferably silicon, Si(100) or Si(111) or doped Si(111), for example. The substrate may comprise a native oxide layer or may be cleaned prior to deposition of film Thin film of $B_2C_2O$ on silicon substrate are provided.

In yet another important aspect of the invention, microelectronic devices comprising thin film of borocarboxyoxides, specifically thin film $B_2C_2O$ are given.

In another preferred embodiment of the method of the present invention, methods are presented for preparing thin film of a compound of the present invention having a formula XqYpZtO wherein X is silicon or carbon, Y is boron or nitrogen, Z is gallium or aluminum, O is oxygen and q and p are each an integer having a value of 1, 2 or 3 and t is zero or 1 and for preparing non-stoichiometric compounds XqYpZtO wherein one or more of the values of q, p or t are non-integral. The method comprises the step of directing Y atoms at a precursor having the formula $H_3X$—O—$XH_3$ in a molecular beam epitaxial chamber in the presence of a silicon substrate under conditions whereby the precursor and Y atoms combine to form thin film on the substrate. Preferably the substrate is Si(100), Si(111) or doped Si(111) and may comprise a native oxide layer or be cleaned by methods known in the art prior to deposition. Thin film of these compounds on a silicon substrate are provided. Substrates other than silicon known to the art may also be employed as substrate.

In another important aspect of the invention, microelectronic devices comprising thin film of a compound made by these methods are provided.

In preferred embodiments of the method of this present invention, superhard thin films of non-stoichiometric siliconoxynitrides are prepared. In this preferred method, atomic nitrogen generated in a molecular beam deposition chamber is directed at precursor $H_3SiOSiH_3$ in the presence of silicon substrate under conditions whereby the precursor and nitrogen atoms react to form thin film of non-stoichiometric silicon oxynitrides on the silicon substrate. Preferably the temperature of the chamber is about 850° C. to 950° C. The substrate may be Si(100), Si(111), doped Si(111) or other substrate known to the art and may comprise a native oxide layer, compliant buffer or may be cleaned prior to deposition of the thin film Preferably the temperature of said chamber is between about 850 to 950° C. and the substrates is highly doped Si(111). Thin film of non-stoichiometric silicoxynitrides deposited on a silicon substrate by these methods are provided.

In yet another important aspect of the invention, microelectronic devices comprising a thin film of non-stoichiometric silicoxynitride made by the present methods are provided.

In certain preferred instances of the invention, methods for depositing superhard thin films of $Si_2N_3AlO$ on a silicon substrate are given. In these methods atomic nitrogen and atomic aluminum are directed at precursor is $H_3SiOSiH_3$ in a molecular beam deposition chamber in the presence of a silicon substrate under conditions whereby the disiloxane reacts with nitrogen atoms and aluminum atoms to form thin film of $Si_2N_3AlO$ on the silicon substrate. In these instances, the silicon substrate may comprise compliant buffer layers comprising in situ generated SiAlONS and related Al silicon oxynitrides. Thin film of $Si_2N_3AlO$ on a silicon substrate are provided.

In yet another important aspect of the present invention, microelectronic devices comprising thin film of $Si_2N_3AlO$ are provided.

In an important aspect of the invention, compounds having the formula $H_3XOXH_3$ wherein X is silicon or carbon are presented as precursors in the preparation of the compounds of the present invention. In preferred instances, $H_3SiOSiH_3$ is presented as a precursor in the preparation of the compounds of the silicon-based compounds of the present invention. In other preferred instances, $H_3COCH_3$ is presented as a precursor in the preparation of the compounds of the carbon-based compounds of the present invention.

In an important aspect of the present invention, methods are provided for preparing disiloxane having the formula $H_3SiOSiH_3$ The method comprises the steps of contacting a halosiloxane, preferably $Cl_3SiOSiCl_3$, with a salt of gallium tetrahydride, preferably $LiGaH_4$, and capturing gaseous $H_3SiOSiH_3$ generated during the reaction between halosiloxane and the hydride. Disiloxane prepared by this method may be used as a precursor for the preparation of thin films of the compounds of the present invention. Preferred compounds made from siloxane prepared by the method of the present invention are $Si_2N_2O$, non-stoichiometric siloxynitrides, silicoborohydrides, most preferably $SiB_2O$ and $Si_2B_2O$, and $Si_2N_3AlO$.

In yet another aspect of the compounds of the present invention may be used as superhard coatings in a variety of applications.

DETAILS OF THE INVENTION

While the present invention will be described more fully hereinafter with reference to the examples and accompanying drawings, in which aspects of the preferred manner of practicing the present invention are shown, it is to be understood at the outset of the description which follows that persons of skill in the appropriate arts may modify the invention herein described while still achieving the favorable results of this invention Accordingly, the description which follows is to be understood as being a broad, teaching disclosure directed to persons of skill in the appropriate arts, and not as limiting upon the present invention.

This invention provides novel superhard compounds having dielectric constants that make them useful as gate dielectrics in CMOS devices and as superhard coatings in a variety of applications. In certain preferred instances, the compounds comprise a Si—O backbone structure and a light element boron or nitrogen. In other instances the compounds comprise a C—O backbone structure and a light element, boron or nitrogen. Compounds having the Si—O backbone and nitrogen and aluminum are also provided.

Figure 1:
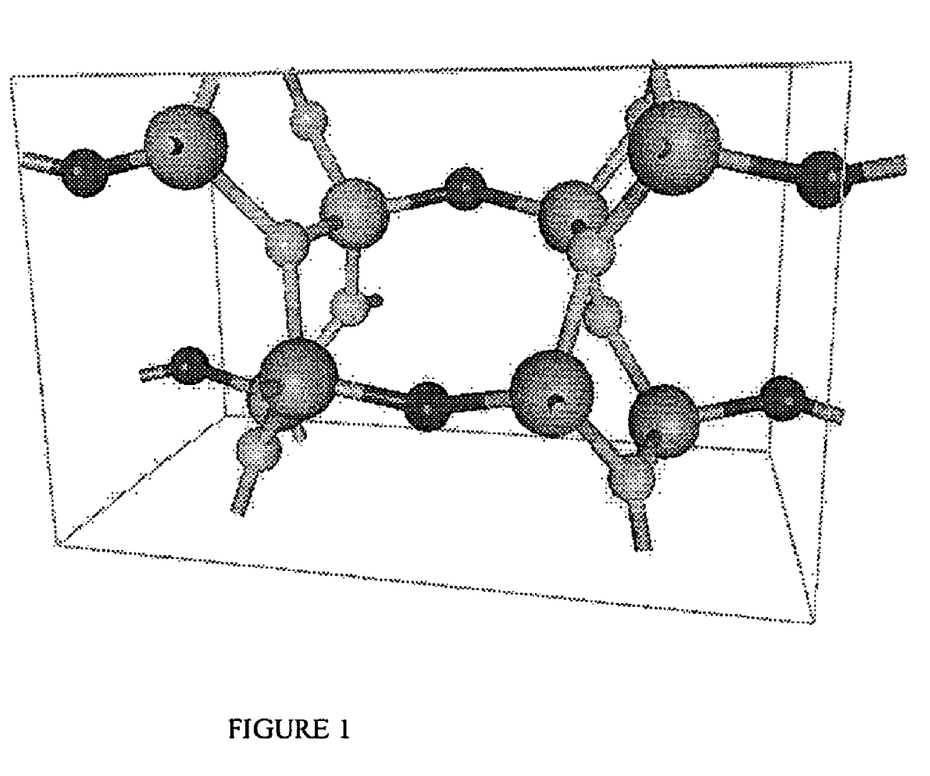
FIG. 1 is a ball-and-stick model illustrating the unit cell structure of $Si_2B_2O$.

Generally, the crystalline structures of these compounds are compact which gives them their hardness and electronic properties. Preferred compounds $Si_2B_2O$ and $SiB_2O$, for example, are isoelectronic to carbon (i.e., four valence electrons per atom) and they crystallize with highly dense diamond-like structures in which all the constituent elements are tetrahedrally coordinated. This leads to superior properties such as superhardness and high stability at extreme conditions. In fact, such materials may be alternatives to diamond in high performance applications. $Si_2B_2O$ has a structure that consists of $SiB_2O$ tetrahedra linked at their corners by O and B atoms. This is essentially the $Si_2N_2O$ structure with all the N atoms at the trigonal sites replaced by $sp^2$ hybridized B (FIG. 1). Alternate structure related to diamond that is denser and harder may also be possible. In this structure all the elements occupy exclusively tetrahedral sites as in diamond. This structure is feasible since $SiB_2O$ is isoelectronic to diamond and is in essence a stoichiometric hybrid between Si and $B_2O$. The latter is a highly sought binary phase of boron with 3-D diamond-like structure that has been predicted to have extreme hardness and other important electronic and mechanical properties.

$C_2B_2O$ is the carbon analogue of $Si_2B_2O$. This system is a stoichiometric hybrid between diamond and the superhard phase $B_2O$ phase. $C_2B_2O$ in the diamond cubic structure but has superior properties such as superhardness as well as higher resistance to oxidation and higher thermal stability than diamond. $Si_2N_2O$ another preferred embodiment has the high pressure $B_2O_3$ structure and it is composed of $SiN_3O$ tetrahedra linked at their corners by O and N atoms (FIG. 2). Each oxygen is connected to two Si (as in SiO2) and the N and Si atoms are, respectively, three and four fold coordinate as in Si3N4.

Certain preferred compounds of the present invention are silicon-based oxygen and boron-containing compounds having the formula $Si_aB_bO_d$, most preferably $Si_2B_2O$ or $SiB_2O$. Other preferred compounds are, non-stoichiometric silicon-based oxygen and nitrogen-containing compounds, silicon-oxynitrides having the formula $Si_aN_bO$. In yet other preferred embodiments carbon-based compounds having the formula $C_aB_bO$, most preferably $C_2B_2O$ are provided. In certain other preferred embodiments of the present invention, compounds having the formula $Si_aN_bZ_cO_d$ wherein Z is aluminum is provided. Most preferably the compound has the formula $Si_2N_3AlO$.

A highly practical and a low-temperature chemical vapor deposition (CVD) method, involving an entirely new approach based on a stoichiometric heterogeneous reaction from gaseous reactants, is described for depositing $Si_2N_2O$ films (5-500 nm) on Si substrates. A new and practical method for depositing superhard thin films of refractory and dielectric silicon oxynitrides, via CVD and MBE reactions of the molecular precursor $H_3Si$—O—$SiH_3$, is demonstrated. Specifically, stoichiometric $Si_2N_2O$ and non-stoichiometric $SiO_xN_y$ films were deposited on Si substrates at 600-850° C., and characterized for their phase, composition, and structure by RBS, EELS, FTIR, FESEM, and HRTEM. The leakage current density voltage ($J_L$-V) characteristics and the capacitance-voltage (C-V) as a function of frequency were determined on MOS (Al/$Si_2N_2O$/SiO/p-Si) structures. The leakage current density, $J_L$ at −6V (+6V) for a 20 nm $Si_2N_2O$ film was 0.1 nA/cm² (0.05 nA/cm²). The dielectric permittivity, K, estimated from the capacitance density in accumulation, was 6 and frequency dispersionless. From the negative flat ban shift ($\Delta V_{fb}$) of 150 mV, the positive fixed charge density ($N_f$) at the Si(100)/SiO interface was calculated to be $2.3 \times 10^{11}$/cm³. The microhardness of $Si_2N_2O$ was determined to be 18 GPa.

The key aspect of this deposition technique is the use of a completely inorganic source ($H_3Si$—O—$SiH_3$) that incorporates the crucial Si—O—Si building block of the target solids, and which does not possess the typical impurity elements such as Cl and C that are potentially detrimental to the electrical and dielectric properties of the material. Moreover, its stoichiometric reaction with $NH_3$ leads to the complete elimination of its H ligands to yield high purity Si—O—N films. This precursor compound also offers an ideal synthetic route for the formation of technologically important oxynitrides, with controlled stoichiometries, and at low temperatures compatible with silicon processing technology.

A novel low-temperature (600-850° C.) chemical vapor deposition (CVD) method, involving the reaction between disiloxane ($H_3Si$—O—$SiH_3$) and ammonia ($NH_3$) is presented to deposit stoichiometric, $Si_2N_2O$, and non-stoichiometric, $SiO_xN_y$, silicon oxynitride films (5-500 nm) on Si substrates. The gaseous reactants are free from carbon and other undesirable contaminants. The deposition of $Si_2N_2O$ on Si [with (100) orientation and a native oxide layer of 1 nm] was conducted at a pressure of 2 Torr and at extremely high rates of 20-30 nm per minute with complete hydrogen elimination.

The deposition rate of $SiO_xN_y$ on highly-doped Si [with (111) orientation but without native oxide] at $10^{-5}$ Torr was ~1.5 nm per minute, and achieved via the reaction of disiloxane with N atoms, generated by an RF source in an MBE chamber. The phase, composition and structure of the oxynitride films were characterized by a variety of analytical techniques. The hardness of $Si_2N_2O$, and the capacitance-voltage (C-V) as a function of frequency and leakage current density-voltage ($J_L$-V) characteristics were determined on MOS (Al/$Si_2N_2O$/SiO/p-Si) structures. The hardness, frequency-dispersionless dielectric permittivity (K), and $J_L$ at 6V for a 20 nm $Si_2N_2O$ film were determined to be 18 GPa, 6, and 0.05-0.1 nA/cm³, respectively.

Additionally, the deposition of non-stoichiometric $SiO_xN_y$ is also demonstrated. The films are characterized by Rutherford backscattering spectroscopy (RBS), secondary ion mass spectrometry (SIMS), high-resolution transmission electron microscopy (HRTEM) and spatially-resolved electron energy loss spectroscopy (EELS), Fourier transform infrared spectroscopy (FTIR), field-emission scanning electron microscopy (FESEM), a Triboscope attached to an atomic force microscope (AFM) for hardness, and electrical and dielectric methods.

The synthetic reaction is similar to that for $Si_2N_2O$ and is illustrated by the equation (1):

$$H_3SiOSiH_3 + B_2H_6 \rightarrow H_2 + Si_2B_2O \qquad (1)$$

Also presented are methods for preparing the carbon analogs of the silicon-based compounds utilizing the precursor dimethyl ether, $H_3COCH_3$ in the CVD or MBE chamber. Compounds made by these methods are, for example, $C_2B_2O$.

The thin films are characterized by Rutherford backscattering spectroscopy (RBS), secondary ion mass spectrometry (SIMS), high-resolution transmission electron microscopy (HRTEM) and spatially-resolved electron energy loss spectroscopy (EELS), Fourier transform infrared spectroscopy (FTIR), field-emission scanning electron microscopy (FESEM), a Triboscope attached to an atomic force microscope (AFM) for hardness, and electrical and dielectric methods.

Figure 7:
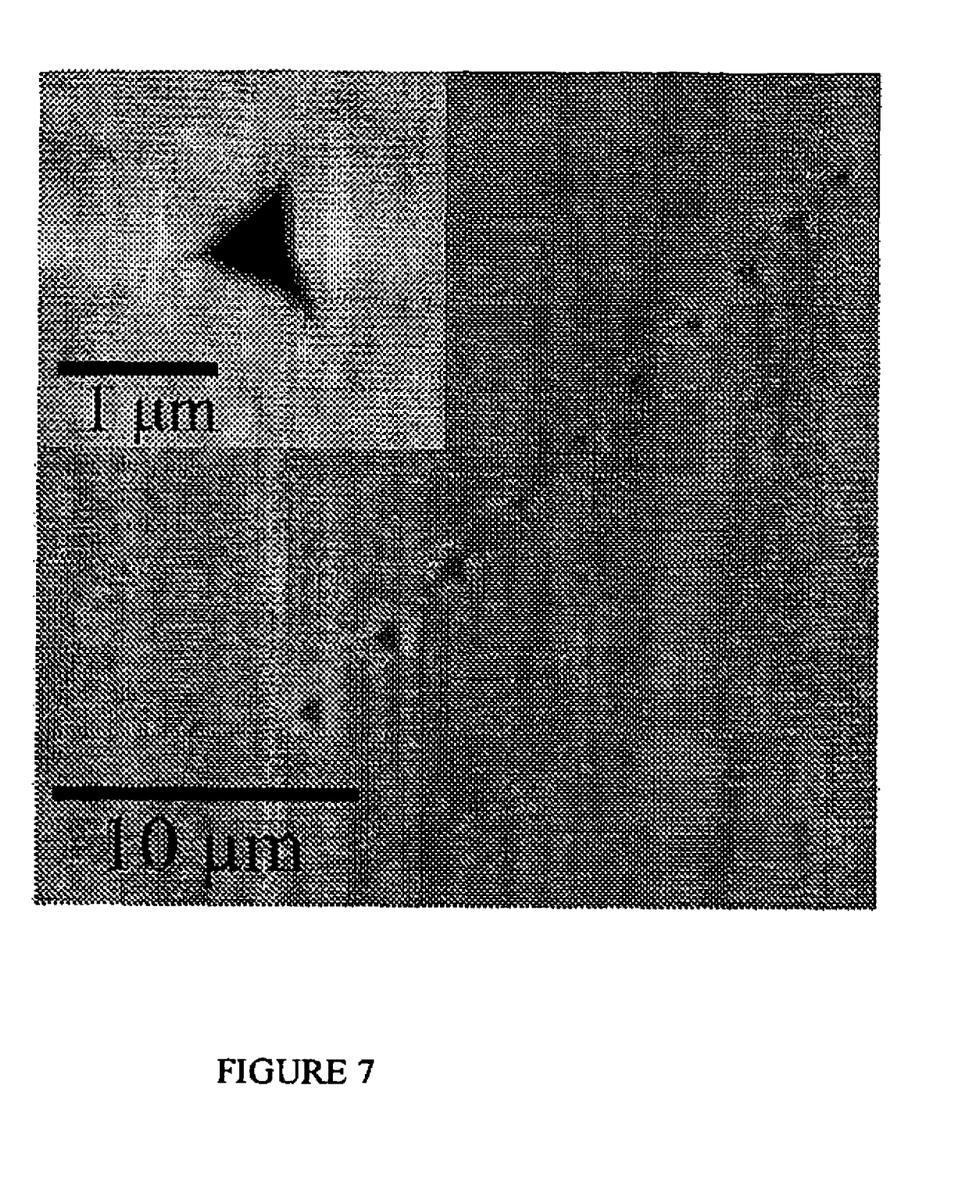
FIG. 7 is AFM image of the Si2B2O film surface showing relatively flat morphology and an array of indentations used to determine the microhardness. Inset is an enlarged view of typical nanoindentation

Determination of the hardness of the compounds give values of GPa of between about 17 to 25 Gpa. These values illustrate the usefulness of the compounds as superhard coatings in a variety of applications. FIG. 7 is AFM image of the preferred embodiment Si2B2O film surface showing relatively flat morphology and an array of indentations used to determine the microhardness. Inset is an enlarged view of typical nanoindentation Chemical Precursors Disiloxane The key feature in the method for deposition of thin films of the present invention comprising silicon is the use of the simple disiloxane ($H_3Si-O-SiH_3$) precursor [16]. The major advantage of utilizing $H_3Si-O-SiH_3$ is the presence of the Si—O—Si framework in the molecule, which provides both the building block for the desired 3-D network and essentially fixes the necessary Si to O ratio. Additionally, the $H_3Si-O-SiH_3$ compound is stable and volatile with a boiling point of —15° C. The vapor pressure at –82° C., 145° C. and –23° C. are 15, 195 and 563 Torr, respectively [16]. The precursor can be stored almost indefinitely in stainless steel containers and like most silanes, ignites spontaneously but not explosively upon contact with air. Moreover, it does not contain carbon or any other potentially impure elements (e.g., Cl, F) in the molecular structure. The deposition of $Si_2N_2O$ films is illustrated in the following reaction (2):

$$H_3Si-O-SiH_3 + NH_3 \rightarrow 6H_2 + Si_2N_2O \quad (2)$$

Moreover, the use of active N species in place of $NH_3$, with controlled energies, may also be used to tailor the N to O ratio in a desired material. Therefore, non-stoichiometric films ($SiO_xN_y$), with composition and property intermediate to those of stoichiometric $Si_3N_4$ and stoichiometric $SiO_2$, may be readily engineered.

Disiloxane is commercially available and also may be prepared by methods disclosed in the present invention.

Dimethyl Ether

The deposition of thin films of the present invention comprising carbon proceeds through the use of the dimethyl ether precursor. Dimethyl ether is commercially available. The simple dimethyl ether precursor may be used in either the CVD chamber or the MBE chamber to make the carbon analogues of the compounds of the present invention. Carbon analogues of the silicon compounds have similar hardness and dielectric properties The deposition of $B_2C_2O$ films is illustrated in the following reaction (3):

$$H_3C-O-CH_3 + BCl_3 \rightarrow B_2C_2O + 6HCl \quad (3)$$

EXPERIMENTAL SECTION

Example 1

This example illustrates the deposition of $Si_2N_2O$ films on silicon substrate in a chemical vapor deposition (CVD) chamber using siloxane as precursor.

The deposition of $Si_2N_2O$ films was carried out in a CVD reactor consisting of a cold-wall quartz tube fitted with a recirculating jacket. The reactor wall temperature was maintained at 700° C. by recirculating preheated ethylene glycol. The Si substrate was p-Si wafer having resistivity of 4.5× 10-3 ohm/cm. The substrates were inductively heated using a high-grade, single-wafer graphite susceptor. Prior to its initial use, the susceptor was out-gassed at 1100° C. under high vacuum ($10^{-3}$ Torr), and then coated with Si via $SiH_4$ decomposition. The pumping system was comprised of a high capacity turbo-molecular pump and a corrosion-resistant pump. The former was used to obtain high vacuum before and after each deposition, and the latter was used during deposition. A typical reactor base pressure was 5-6× $10^{-7}$ Torr. The gaseous reactants, $H_3Si-O-SiH_3$ and $NH_3$, were diluted with research grade $N_2$ and introduced into the reactor through precalibrated glass flow controllers. The deposition was conducted at a pressure of 2 Torr and temperatures between 600-850° C. Under these conditions, stoichiometric $Si_2N_2O$ films ranging in thickness between 5 and 500 nm, were deposited on Si [with an orientation of (100) and a native oxide layer of 1 nm] at extremely high rates of 20-30 nm per minute.

Physico-Chemical Characterization of $Si_2N_2O$ Films Prepared in Example 1

RBS in the random mode was routinely used to obtain the Si, N, and O concentration and to estimate the film thickness. A typical plot is illustrated in FIG. 2. Additionally, elastic N and O resonance nuclear reactions at 3.72 MeV and 3.0 MeV, respectively, were used to establish the precise $Si_2N_2O$ elemental ratios. Since forward recoil experiments indicated that the hydrogen content was at background levels, the elimination of the Si—H and N—H bonds from the reactants occurred completely during growth.

Figure 5:
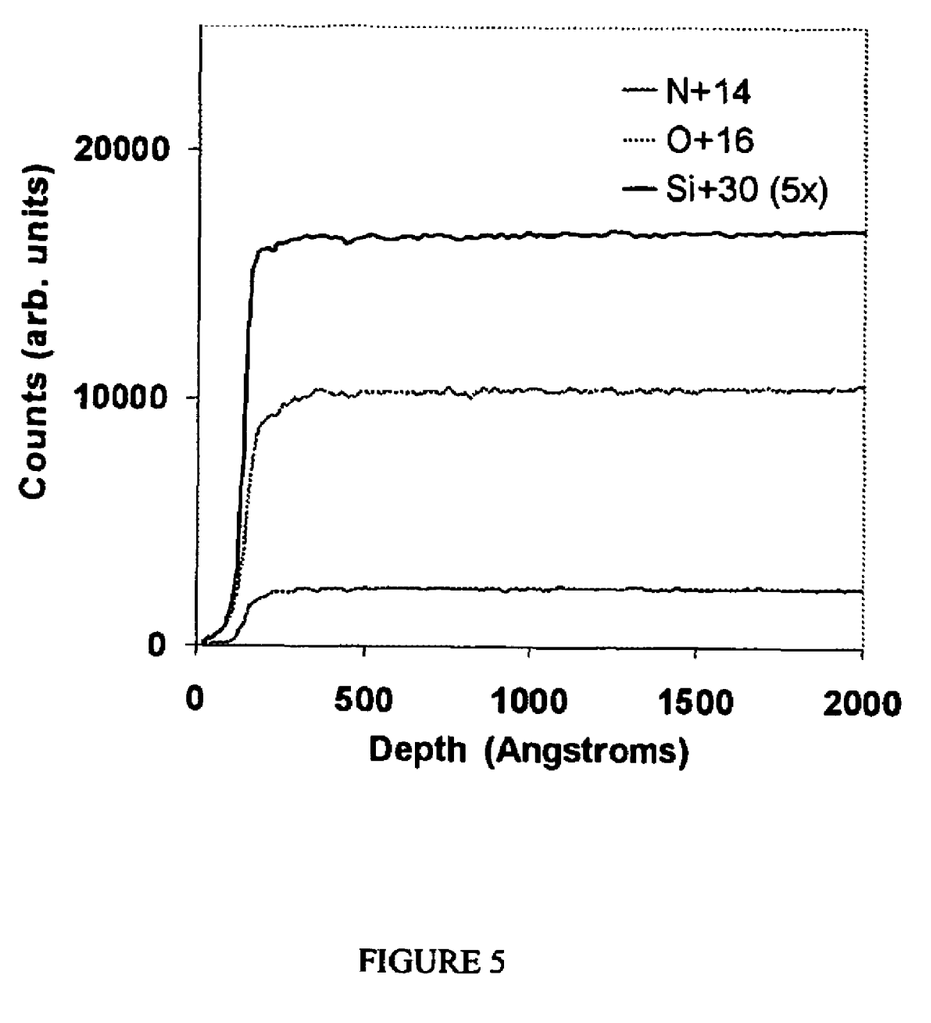
FIG. 5 is a SIMS elemental depth profile of $Si_2N_2O$ showing a uniform distribution of the elements.

SIMS was used to confirm the presence of the desired elements and the absence of carbon impurities, and to demonstrate that the elemental content was homogeneous throughout the material. A representative SIMS depth profile, showing the highly uniform elemental distribution in the film thickness direction, is given in FIG. 5.

Figure 4:
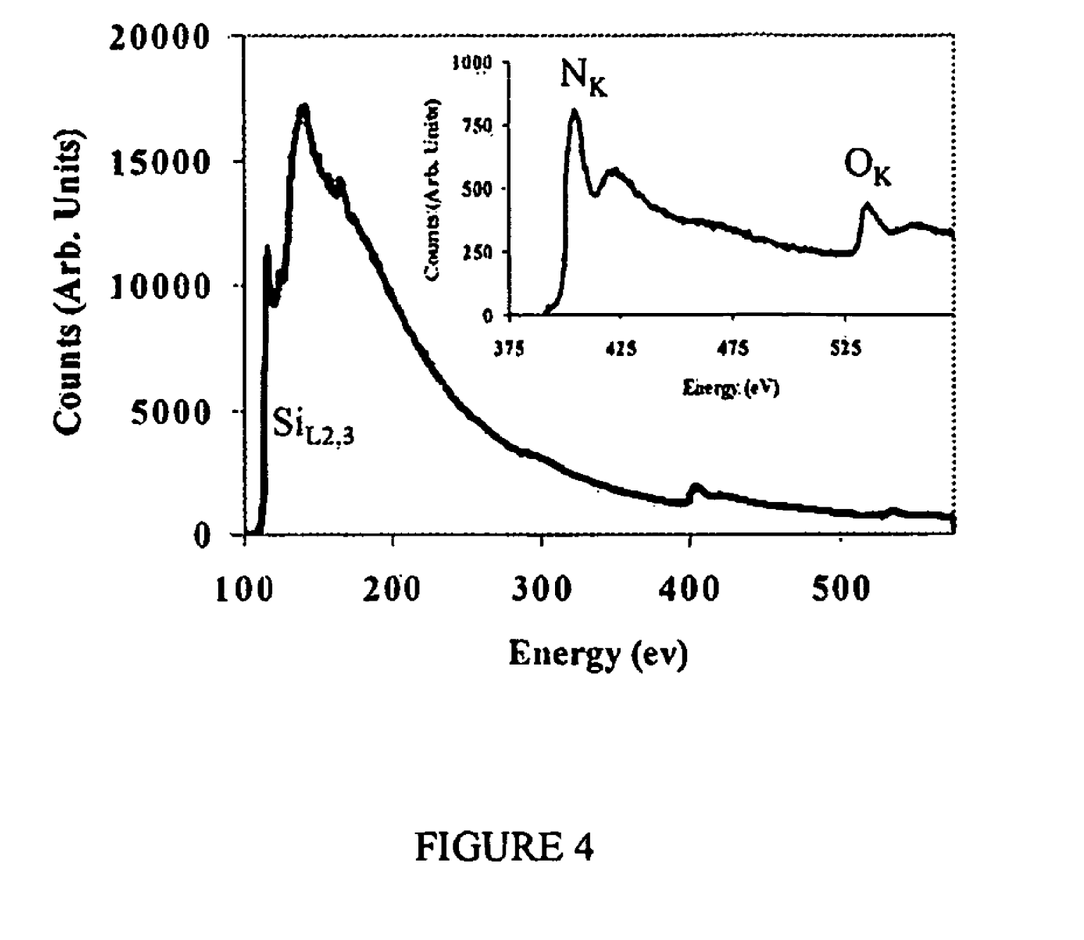
FIG. 4 illustrates the $L_{2,3}$ ionization edge of Si and the K ionization edges of O and N (inset) in an EELS spectrum of $Si_2N_2O$.

HRTEM (not shown here) indicated that the films were highly uniform in thickness and displayed flat and smooth surface morphology. The selected area electron diffraction (SAED) and high-resolution images confirmed that the material was amorphous. Spatially-resolved EELS, used to examine the elemental content at the nanometer scale and characterize the local bonding environment of the atoms, showed that the constituent elements appeared at every nanometer step probed; this consistent with a single-phase material. The absolute elemental concentration (determined by EELS) was close to the stoichiometric value for $Si_2N_2O$, which corroborated the RBS results. An EELS spectrum featuring the ionization edges of the elements is shown in FIG. 4. The near-edge fine structure is indicative of a 3-D $Si_2N_2O$ network.

Figure 6:
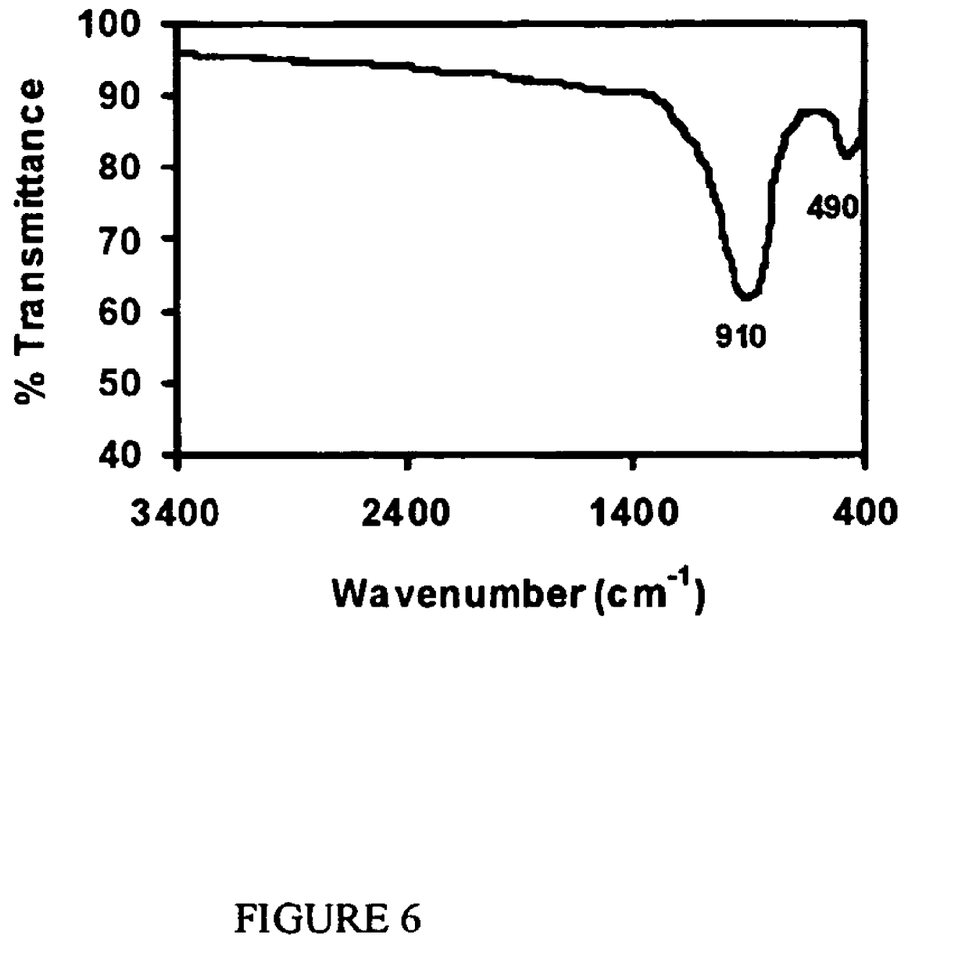
FIG. 6 is a FTIR spectrum of a $Si_2N_2O$ showing the N—Si—O absorption peaks corresponding to stretching (900 cm$^{-1}$) and bending (470 cm$^{-1}$) modes.

The FITR spectrum in FIG. 6 exhibited phonon modes consistent with the single-phase $Si_2N_2O$. A strong, well-defined peak centered at 900 cm–1 and a weak peak at 470 cm–1 corresponds to the N—Si—O stretching and bending modes, respectively, of the $Si_2N_2O$ phase [15]. Note, the 900 cm–1 peak is located at frequencies intermediate to those of the corresponding stretching odes for stoichiometric $SiO_2$ (~980 cm–1) and $Si_3N_4$ (~850 cm–1). Moreover, in the region between 2100 cm–1 and 2000 cm–1, of the spectrum, additional peaks attributable to Si—H vibrations are absent. This is consistent with the RBS result of complete elimination of H ligands from the precursor.

The hardness of the films was determined using a Hysitron Triboscope attached to a Nanoscope III AFM (digital instruments). The hardness is defined as the applied load divided by the surface area of the impression when a pyramidal shaped diamond indentor is pressed normalloyinto the film. Pure quartz (SiO2) was used as a standard and its hardness was measured to be close to 9.5 GPa For example, the hardness of single-crystal Al2O3 (sapphire) was measured to be 22 GPa. Using the same experimental conditions, the hardness of the Si2N2O films are was approximately 18 GPa.

Characterization of Electrical and Dielectric Properties of $Si_2N_2O$ Films Prepared in Example 1

Including the native oxide layer (SiO2; x~1) of 1 nm [8], the observed $Si_2N_2O$ film thicknesses by FESEM were 20 nm, 30 nm, 37.5 nm, and 65 nm, in agreement with RBS and HRTEM results. From the four-point probe measurement of the electrical resistivity of the Si wafer, the dopant density was estimated to be $2.5 \times 10^{19}$ cm$^{-3}$ [16]. For the room temperature electrical and dielectric measurements, aluminum (Al) top electrodes (100 nm thick and 530 um diameter) were deposited onto samples through a shadow mask by e-beam evaporation. Also, 100 nm Al films were deposited on the backside of Si to improve the bottom contacts. The samples were placed in an analytical probe system equipped with a chuck (3190 MC Systems), and the top electrodes were contacted with microprobes (1097 MODEL; mc Systems). The high frequency (1-100 KHz, ac$_{osc}$ 20 mV) capacitance-voltage (C-V) characteristics and the dc current-voltage (I-V) characteristics of the capacitors were measured using a multi-frequency LCR meter (HR Impedance analyzer, 4284A) and current meter (HPn4140B), respectively.

The leakage current densities, $J_L$ (with 10 s delay), at $-6V$ ($-10V$) and $+6$ V ($+10V$) for a 20 nm Si$_2$N$_2$O film were 0.1 nA/cm$^3$ (100 nA/cm$^3$) and 0.05 nA/cm3 (3nA/cm$^3$), respectively. This asymmetry in the magnitude of $J_L$ for positive and negative gate voltages stems from the asymmetry if the band alignment and band bending at the Si/SiO$_x$ and Al/Si$_2$N$_2$O interfaces, and the consequent asymmetry in the transmission probability [19-22].

The C-V measurements were carried out on MOS (Al/Si$_2$N$_2$O/SiO/p-Si) structures. From the measured capacitance densities in accumulation ($C_{acc}$/A) at $-5V$, which were dispersionless in the frequency range measured, the total equivalent SiO$_2$ thickness or EOT$_{tot}$(i.e., EOT$_{tot}$=$\epsilon_0$K$_{SiO2}$/($C_{acc}$/A)) and K$_{Si2N2O}$ as a function of Si$_2$N$_2$O thickness were calculated and are tabulated in Table I. Note, for these calculations the K of the interfacial SiO layer was estimated to be 7.8 (assuming a linear extrapolation between the K of 11.7 for Si and 3.9 for SiO$_2$) and quantum corrections were not applied.

From the slope of a Schotzky plot ($1/C^2$ versus V), with data from the depletion region (+1 to +5V) of the C-V curve for a 20 nm film at 100 KHz, the dopant density was calculated using the following equation [19] (4):

$$N_A = \frac{2}{qK_sA^2 d(1/C^2)/dV} = 2.8 \times 10^{19} \text{ cm}^{-3} \quad (4)$$

where $K_s$=11.7, A=0.0022 cm$^2$ and $(1/C^2)/dV$=9.7$\times 10^{16}$. Note, this value of $N_A$ is in agreement with that derived from the four-point probe method.

Considering this doping level (2.8$\times 10^{19}$/cm of p-Si, the work function of Al (4.2 eV), and the electron affinity of Si (4.05 eV), the ideal flat band, $V_{fbo}$=$\phi_{MS}$ was calculated to be $-0.85$ V. At 100 KHz, the actual $V_{fb}$ for the Al/Si$_2$N$_2$O/SiO/p-Si structure was $-1V$. This corresponds to a negative flat band shift ($\Delta V_{fb}$=$V_{fb}$-$\phi_{MS)\ of\ 150}$ mV. Therefore, the positive fixed charge density $N_f$=$(\Delta V_{fb}C_{acc})/qA)$ at the SiOSi interface was estimated to be 2.3$\times 10^{11}$/cm$^2$. The potential origin of this positive charge can be correlated with roughness at the Si(100)/SiO interface and the non-stoichiometry of SiO$_x$ [19,21,23].

Table 1 gives the measured and estimated parameters, from C-V data at a frequency of 100 KHz, for Si$_2$N$_2$O film with different thickness. Note, $\phi_{MS}$=$-0.85$ V, dopant density of p-Si is 2.8$\times 10^{19}$/cm$^3$, and electrode area=0.00216 cm$^2$.

TABLE 1

| Thickness of Si$_2$N$_2$O, nm | t$_{SiO}$, nm | (C$_{acc}$/A), fF/µm$^2$ | EOT$_{tot}$, nm | KSi$_2$N$_2$O |
|---|---|---|---|---|
| 20 | 1 | 2.45 | 14.1 | 5.9 |
| 37.5 | 1 | 1.29 | 26.7 | 5.7 |
| 65 | 1 | 0.8 | 43.4 | 6.0 |

Example 2

This Example illustrates the deposition of non-stoichiometric Si—O—N Films on Si substrated prepared MBE chamber utilizing siloxane as precursor.

The deposition of non-stoichiometric, silicon oxynitride (SiOxNy) films, via reactions of the H$_3$Si—O—SiH$_3$ precursor with N atoms generated by an RF source in an MBE chamber, was carried out. The base pressure of the chamber was $10^{-10}$ Torr, which increased to $10^{-4}$ Torr during the deposition. The plasma source power was operated at 400 W with a typical N pressure of $10^{-7}$ Torr. The SiO$_x$N$_y$ films were deposited at 900° C. on highly-doped Si (111) substrates, which were previously flashed at 1050° C. and $10^{-10}$ Torr to remove the native oxide layer. The duration of each deposition was 30 to 45 minutes, yielding an average growth rate of ~1.5 n per minute.

Characterization of Non-Stoichiometric Si—O—N Films Made by the Method of Example 2

Figure 3:
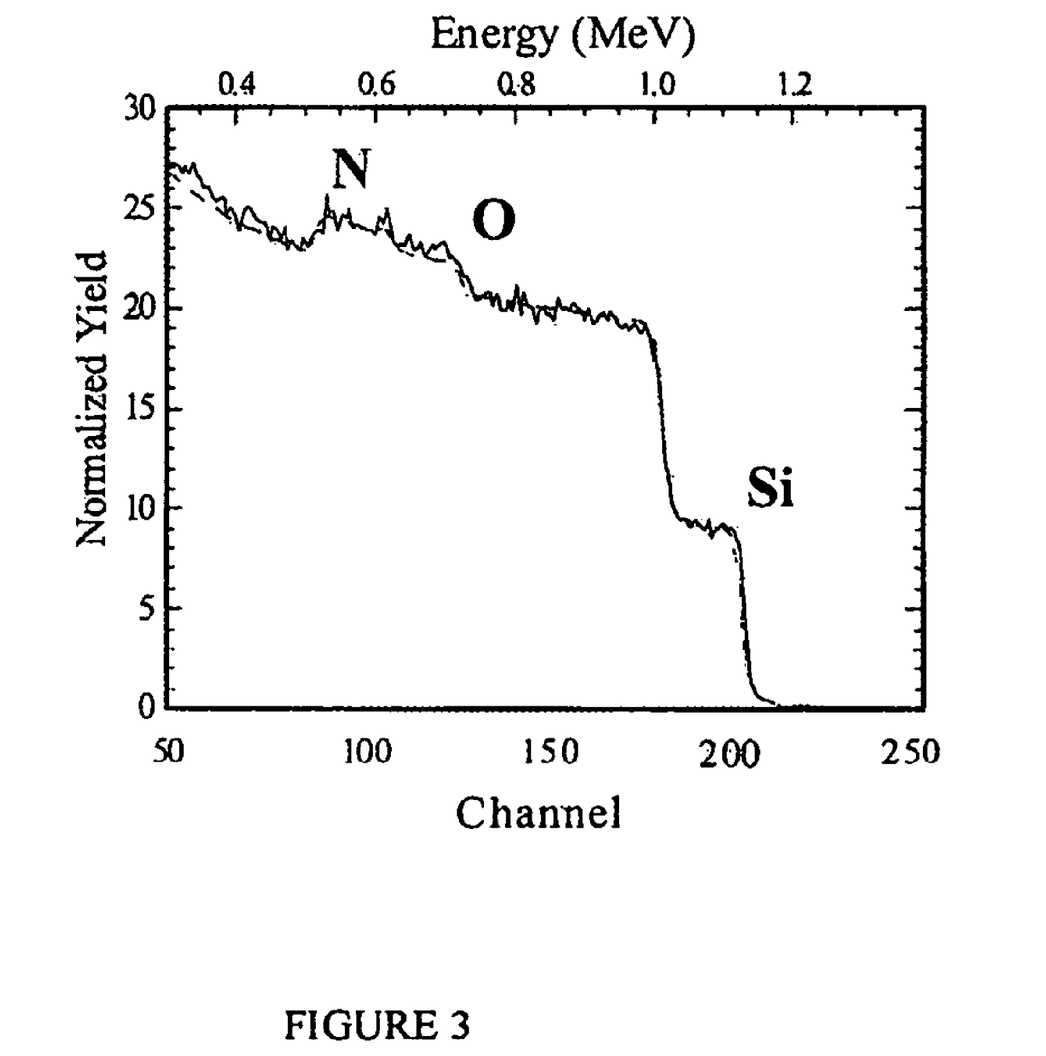
FIG. 3 is a Rutherford Back Scattering (RBS) spectrum of a $Si_2N_2O$ film deposited at 850° C. The RBS simulation by RUMP, shown as a dashed line, gives the atomic compositions of Si, O, and N.

RBS analysis of these films illustrated inf FIG. 3 revealed that the Si, N and O concentrations were 45 at. %, 50 at.% and 5 at.%, respectively, indicating that the oxygen content in these films were substantially lower than that of Si$_2$N$_2$O (which is 20 at %). The FTIR spectrum showed the characteristic stretching mode at 845 cm$^{-1}$ which is lower in energy with respect to Si$_2$N$_2$O but almost identical to that of beta Si$_3$N$_4$. This data indicates that the bonding arrangement of this SiO$_x$N$_y$ material is based predominately on the Si$_3$N$_4$ network with some of the lattice sites occupied by oxygen atoms. The dramatic deviation from the ideal Si$_2$N$_2$O stoichiometry is attributed to displacement of oxygen from the H$_3$Si—O—SiH$_3$ precursor by the highly reactive N atoms. Therefore, by judicious adjustments in the growth parameters, particularly the flux of the nitrogen beam, the O content in the films may be precisely tuned. Consequently this method provides a simple and convenient pathway leading to the formation of non-stoichiometric gate dielectric films with composition and properties intermediate to those of Si$_3$N$_4$ and SiO$_2$.

Example 3

This example illustrates the deposition of C$_2$B$_2$O films on silicon substrate in a chemical vapor deposition (CVD) chamber using dimethylether as precursor.

The deposition of C$_2$B$_2$O films is carried out in a CVD reactor under the reaction conditions given in Example 1. The Si substrate is p-Si wafer. The gaseous reactants, CH3-O—CH$_3$ and BCl$_3$ are diluted with research grade N$_2$ and introduced into the reactor through pre-calibrated mass flow controllers. The molar ratio of BCl$_3$ to precursor is approximately 2:1. The deposition is conducted at a pressure of 2 Torr and temperatures between 600-850° C. Under these conditions, stoichiometric C$_2$B$_2$O films ranging in thickness between 5 and 500 nm, is deposited on Si.

Example 4

This Example illustrates the deposition of $Si_2B_2O$ films on silicon substrate in a chemical vapor deposition (CVD) chamber using disiloxane as precursor.

Thin films with composition close to the desired $Si_2B_2O$ were deposited on Si(100) at 735° C. with rates ranging from 15 nm to 20 nm per minutes. An exactly stoichiometric mixture of the reactant gases and a deposition temperature above 700° C. were necessary to obtain films with $Si_2B_2O$ stoichiometry.

Example 5

This Example illustrates the deposition of $SiB_2O$ films on silicon substrate in a chemical vapor deposition (CVD) chamber using disiloxane as precursor.

Thin films with composition close to $SiB_2O$ were deposited on Si(100) under essentially same conditions as described in Example 4, but the temperature was lowered to 500 to 650° C. It is proposed that the Si deficiency in this relative to the Si2B2O compound prepared in Example 4 is due to incomplete reactions and possible elimination of SiH4 from the thermal disproportionation of the precursor as is illustrated in Equation (4):

$H_3Si-O-SiH_3 + B_2H_6 \rightarrow H_2 + SiB_2O + SiH_4$ (5)

Nevertheless, the $SiB_2O$ composition in itself is unique because it is also isoelectronic to diamond and may crystallize with the diamond structure.

Characterization of $Si_2B_2O$ and $SiB_2O$

The elemental concentrations of $Si_2B_2O$ and $SiB_2O$ were determined by RBS. SIMS was also used to confirm the presence of the desired elements and the lack of impurities, and to show that the elemental content was homogeneous through the material. FTIR showed bands corresponding to Si—O, B—O and Si—B lattice modes a result, consistent with the structure illustrated in FIG. 1. Cross-sectional TEM revealed that the as-deposited samples were amorphous. More crystalline samples may be prepared by reducing the growth rates and by conducting post-growth annealing. The hardness of $Si_2B_2O$ was measured to be 17 GPa. The hardness of $SiB_2O$ was measured to be 12 GPa

Example 6

This Example illustrates the preparation of thin film $Si_2AlN_3O$ in a MBE chamber. Precursor disiloxane was bombarded with nitrogen atoms and aluminum atoms in a MBE chamber under condition described in Example 2. The hardness of $Si_2AlN_3O$ is 25 Gpa.

Example 7

This Example illustrates the preparation of thin film $B_2C_2O$ on a silicon substrate.

Precursor $H_3COCH_3$ and $BCl_3$ are contacted in essentially equimolar amounts in a CVD chamber according to the method described in Example 1. The chamber was maintained at a temperature of about 700° C. to 850° C. The thickness of the deposited $B_2C_2O$ film was about 5 to 500 nm on Si(100) substrate. Si(111) and doped Si(111) may also be employed in this example and said substrate may comprise a native oxide layer or be cleaned by methods known in the art prior to deposition of $B_2C_2O$ film.

Example 8

This example illustrates the preparation of disiloxane $H_3SiOSiH_3$. Commercially available $Cl_3SiOSiCl3$ is diluted in diethyl ether and cooled to 78° C. Solid LiGaH4 is added to the Cl3SiOSiCl3/solution through a solid addition funnel. Gaseous O(SiH3) is formed immediately and it is removed and purified by trap-to-trap distillation. The yield is typically 30-50%. The compound is identified by mass spectrometry and IR spectroscopy and shown to be identical with commercially available disiloxane.

Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

REFERENCES

[1] L. Feldman, E. P. Gusev, E. Garfunkel, in "Fundamental Aspects of Ultrathin Dielectrics on Si-based Devices", Eds. E. Garfunkel, E. P. Gusev and Ya Vul' A, Kluwer, Dordrecht, Netherlands (1998).

[2] E. P. Gusev, H-C Lu, E. L. Garfunkel, T. Gustafsson, M. L. Green, *IBM J. Res. Develop.* 43, 265 (1999).

[3] S. V. Hattangady, H Niimi, G Lucovsky, *J. Vac. Sci. Technol.*, A14, 3017 (1996).

[4] F. H. P. M. Habraken, A. E. T. Kuiper, *Mater. Sci. Eng. Rep*, R12, 123 (1994).

[5] G. Lucovsky, IBM J. Res. Dev, 43 301 (1999).

[6] Ultrathin $SiO_2$ and High-K Materials for ULSI Gate Dielectrics, Eds. H. Huff, C. A. Richter, M. L. Green, G. Lucovsky and T. Hattori, *Materials Research Society,* Warrendale, Pa. (1999).

[7] Alternative Gate Dielectrics for Microelectronics, Eds. R. W. Wallace and G. Wilk, *MRS Bulletin,* 27 [3] (2002).

[8] S. K Dey, C. -G. Wang, D. Tang, M. J. Kim, R. W. Carpenter, C. Werkhoven and E. Shero, submitted to *Journal of Applied Physics*, May 22, 2002.

[9] D. A. Buchanan. IBM J. Res. Develop, 43(3) (1999) 245.

[10] R. Roucka, J. Tolle, A. V. G Chizmeshya, P. A. Crozier, C. D. Poweleit, D. J. Smith, I. S. T. Tsong, and J. Kouvetakis, Phys. Rev. Lett., 88 (20) (2002) 206102.

[11] R. Roucka, J. Tolle, P. A. Crozier, D. J. Smith, I. S. T. Tsong, and J. Kouvetakis, Appl. Phys. Lett., 79 (2001) 2080.

[12] S. R. Srivinasa, L. Cartz, J. D. Jorgensen, T. G. Worlton R. A. Beyerlein, M. Billy, J. Appl. Cryst. 10 (1977) 167.

[13] I. Idrestedt, C. Brosset, Acta Chimica Scandinavica, 18 (1964) 1879.

[14] R. van Weeren, E. A. Leone, S. Curran, L. C. Klein, S. Danforth, J. Am. Ceram. Soc., 77 (1994) 2699.

[15] P. Wendor, R. de Ruiter, J. Chem. Soc. Chem. Commun., (1989) 320.

[16] D. F. Shriver M. A. Drezdzon, *The manipulation of airsensitive compounds,* pp 289-311, Wiley & Sons, Inc. (1986).

[17] M. I. Baraton, J. C. Labbe, P. Qiuintard, G. Roult, Mat Res. Bull., 20 (1985) 1239.

[18] http://ece-www.colorado.edu/~bart/book/resistiv.xls

[19] D. K. Schroder, *Semiconductor material and device characterization*, Ch. 1. John Wiley & Sons, Inc. (1998).

[20] S. K. Dey, J. J. Lee, and P. Alluri, *Jpn. J. Appl. Phys,* 34 [6], 3142-3152 (1995).
[21] M. Houssa M. Naili, C. Zhao, H. Bender, M. M. Heyns and A. Stesmans, *Semiconductor Science and Technology,* 16, 31-38 (2001).
[22] R. S. Johnson, G. Lucovsky, I. Baumvol, *J. Vac. Sci. Technol.,* A19[4] 1353-1360 (2001).
[23] L. Lai, K. J. Herbert, and E. A. Irene, *J Vac. Sci. Technol.,* B17 [1] 53-59 (1999).

The invention claimed is:

1. A compound having a formula $X_qY_pZ_tO$ wherein X is silicon or carbon, Y is boron or nitrogen, Z is gallium or aluminum, O is oxygen and q and p are each an integer having a value of 1, 2 or 3 and t is zero or 1, provided that when X is silicon, and t is zero, Y is not nitrogen.

* * * * *